(12) United States Patent
Kishishita

(10) Patent No.: US 7,737,557 B2
(45) Date of Patent: Jun. 15, 2010

(54) SEMICONDUCTOR APPARATUS

(75) Inventor: Keisuke Kishishita, Kyoto (JP)

(73) Assignee: Panasonic Corporation, Osaka (JP)

( * ) Notice: Subject to any disclaimer, the term of this patent is extended or adjusted under 35 U.S.C. 154(b) by 370 days.

(21) Appl. No.: 11/541,677

(22) Filed: Oct. 3, 2006

(65) Prior Publication Data

US 2007/0096325 A1    May 3, 2007

(30) Foreign Application Priority Data

Oct. 4, 2005    (JP) .............................. 2005-290709

(51) Int. Cl.
*H01L 23/48* (2006.01)
*H01L 23/52* (2006.01)
*H01L 29/40* (2006.01)

(52) U.S. Cl. .................. 257/758; 257/750; 257/751; 257/754; 257/757

(58) Field of Classification Search .............. 257/750, 257/751, 754, 757, 758
See application file for complete search history.

(56) References Cited

U.S. PATENT DOCUMENTS

| 6,489,197 | B2 * | 12/2002 | Uchiyama | 438/253 |
|---|---|---|---|---|
| 6,635,918 | B1 * | 10/2003 | Narui et al. | 257/311 |
| 6,734,549 | B2 * | 5/2004 | Takeoka et al. | 257/700 |
| 6,809,419 | B2 * | 10/2004 | Minami et al. | 257/758 |
| 6,835,632 | B2 * | 12/2004 | Shimamoto et al. | 438/382 |
| 7,032,196 | B2 * | 4/2006 | Takeoka et al. | 716/4 |
| 7,180,192 | B2 * | 2/2007 | Hasunuma et al. | 257/758 |
| 2004/0016946 | A1 * | 1/2004 | Oashi | 257/296 |
| 2004/0140492 | A1 * | 7/2004 | Ooishi | 257/295 |
| 2004/0195672 | A1 * | 10/2004 | Takeoka et al. | 257/700 |
| 2004/0199840 | A1 * | 10/2004 | Takeoka et al. | 714/727 |
| 2004/0250185 | A1 | 12/2004 | Date | |
| 2005/0051871 | A1 * | 3/2005 | Lowther et al. | 257/531 |
| 2006/0076641 | A1 * | 4/2006 | Cho et al. | 257/528 |
| 2006/0131612 | A1 * | 6/2006 | Kishishita | 257/208 |
| 2007/0069314 | A1 * | 3/2007 | Wilson et al. | 257/421 |
| 2007/0102824 | A1 * | 5/2007 | Chun | 257/774 |
| 2007/0114671 | A1 * | 5/2007 | Hsu et al. | 257/774 |
| 2007/0257323 | A1 * | 11/2007 | Tsui et al. | 257/382 |
| 2008/0285333 | A1 * | 11/2008 | Lankhorst et al. | 365/163 |

FOREIGN PATENT DOCUMENTS

JP    2004-301661    10/2004

* cited by examiner

*Primary Examiner*—Wael Fahmy
*Assistant Examiner*—Telly D Green
(74) *Attorney, Agent, or Firm*—McDermott Will & Emery LLP

(57) ABSTRACT

In the present invention, a wiring layer comprises wirings respectively having different sheet resistance values, or a contact for connecting opposing wiring layers comprises contacts having different sheet resistance values respectively.

11 Claims, 14 Drawing Sheets

F I G. 3 A
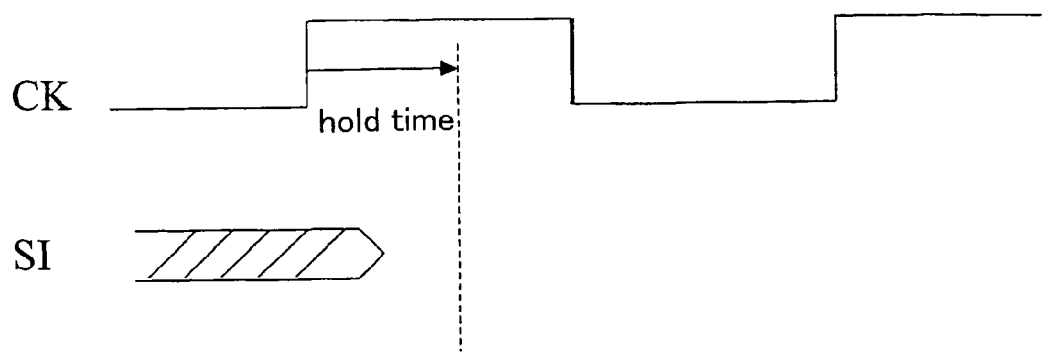
F I G. 3 B
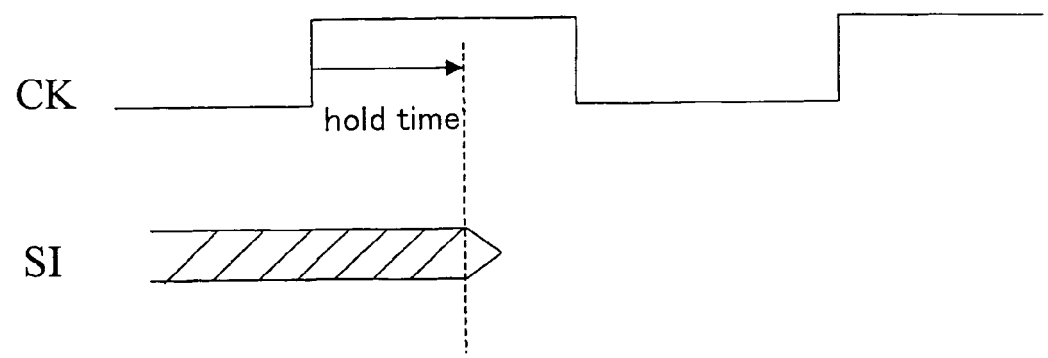

F I G. 4
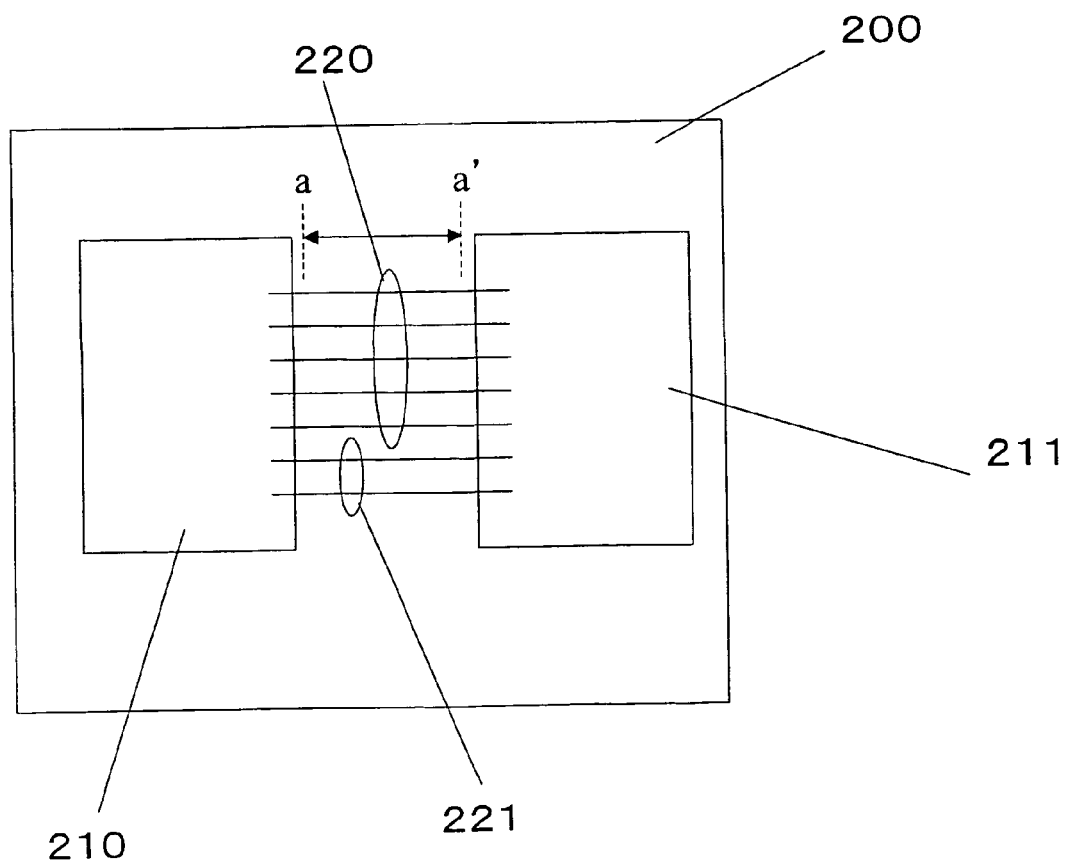

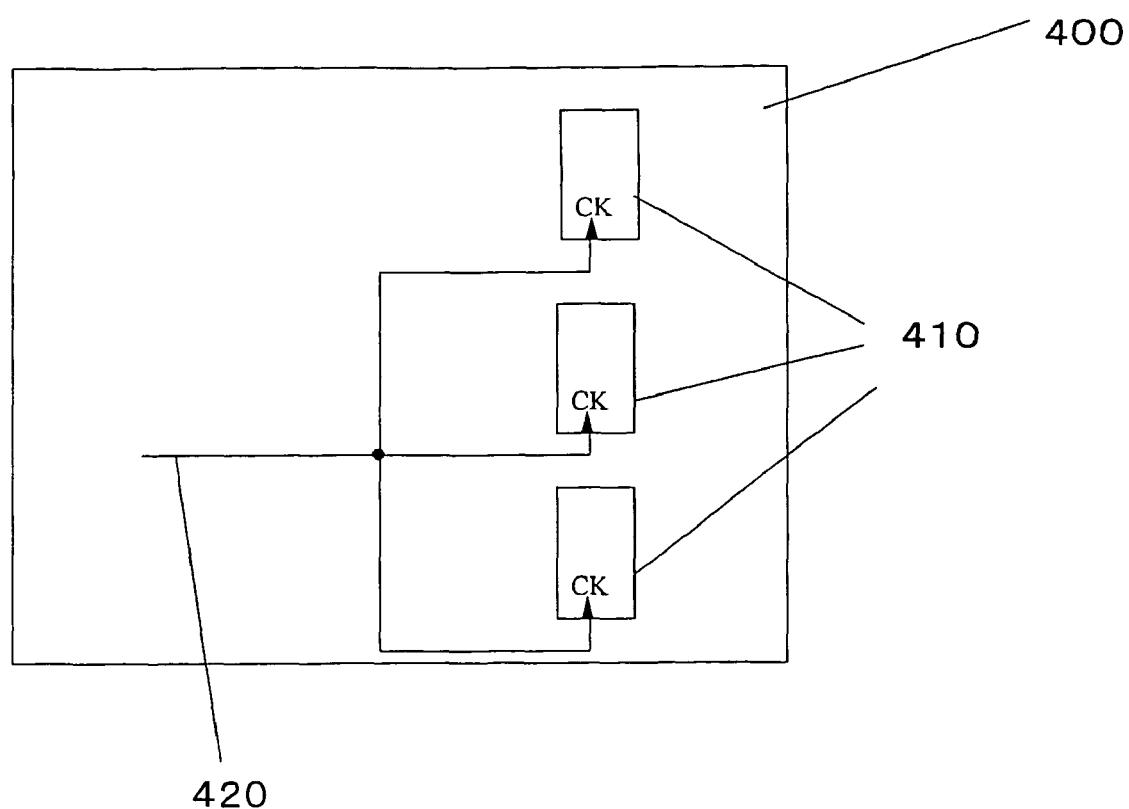
F I G. 7

F I G. 8
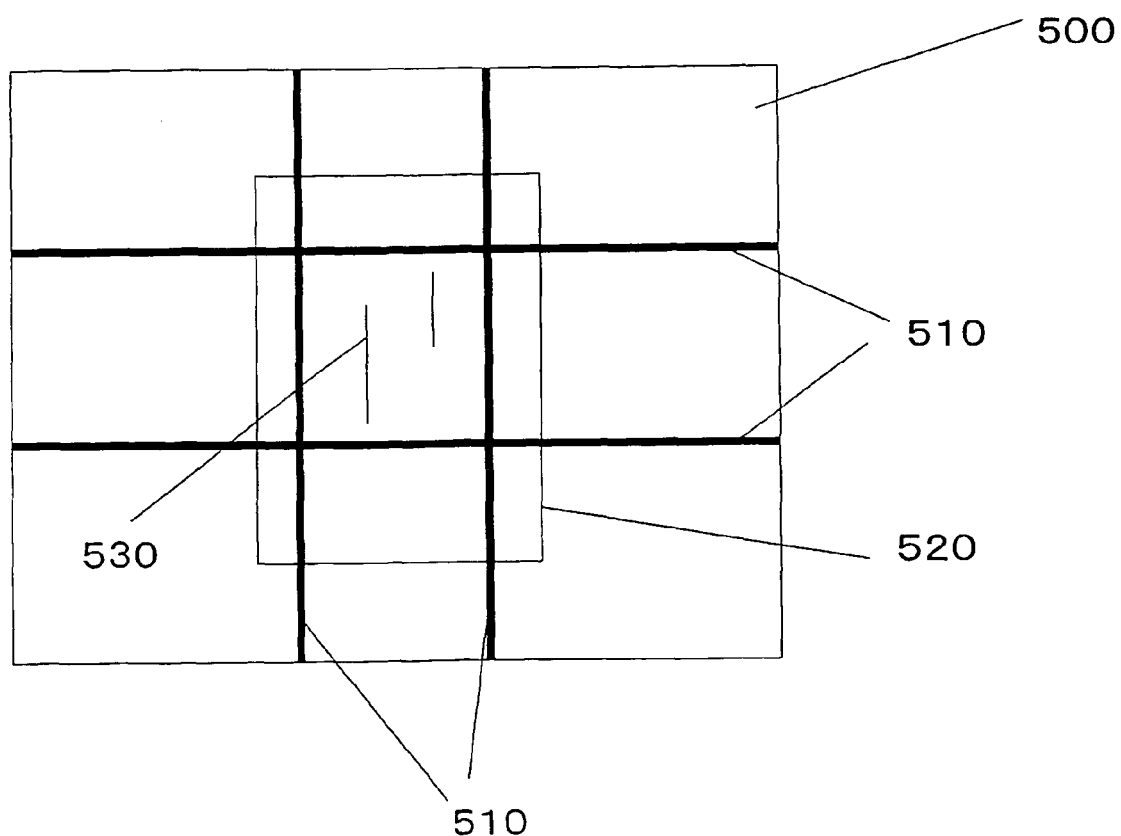

F I G. 9
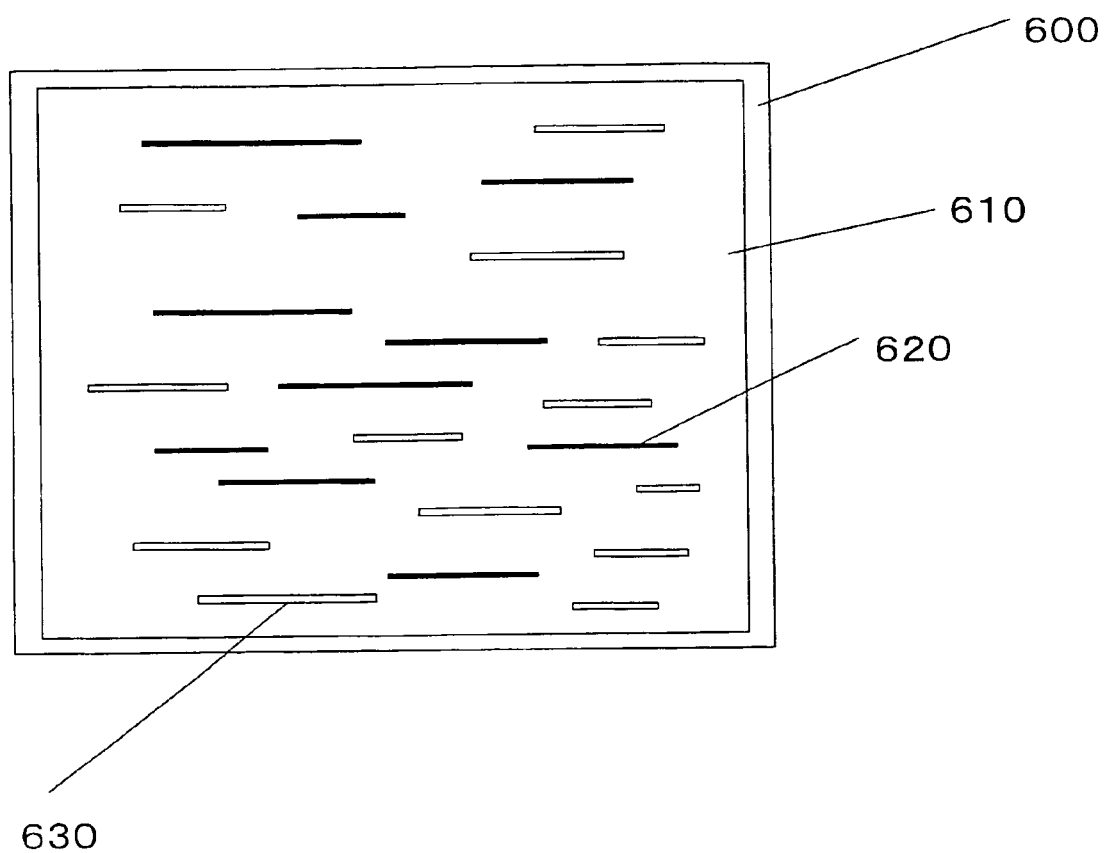

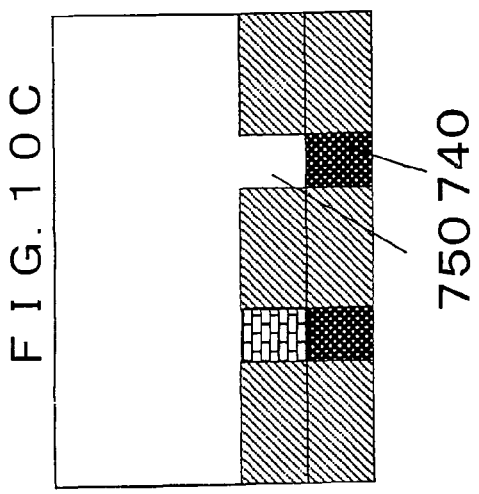
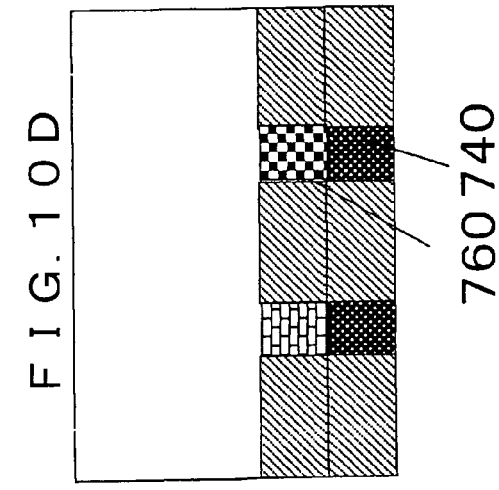
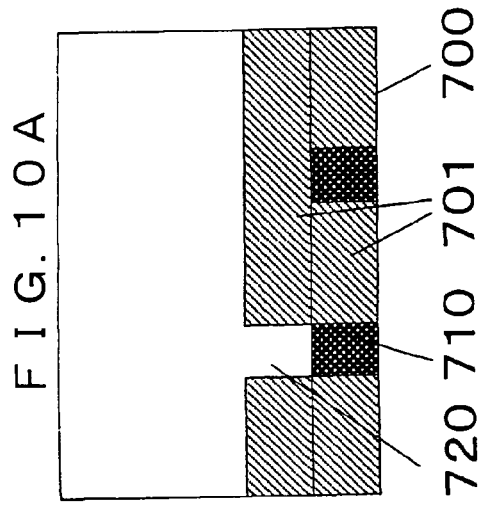
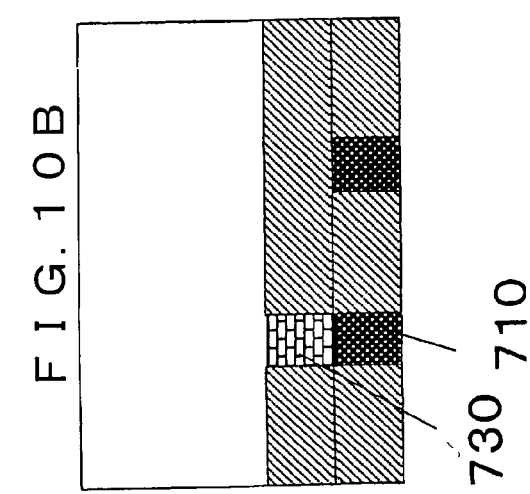

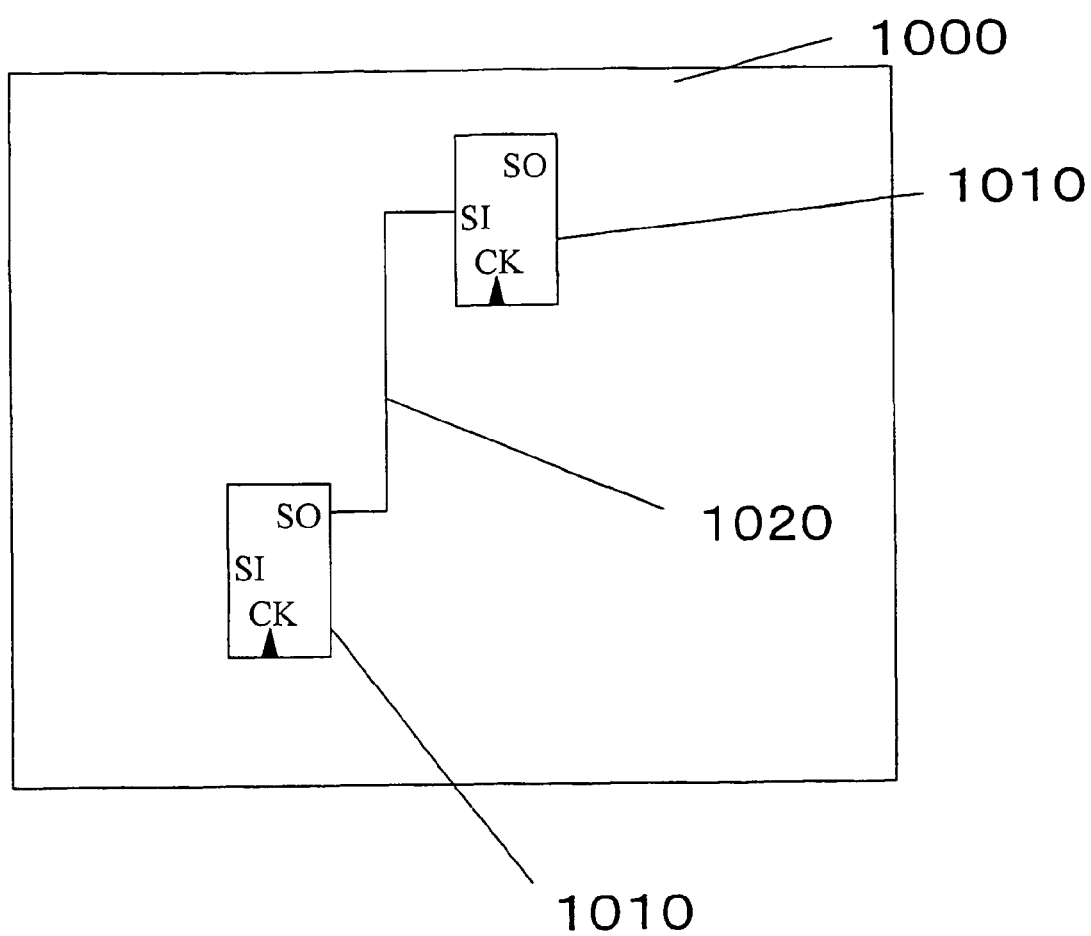
F I G. 1 5

SEMICONDUCTOR APPARATUS

BACKGROUND OF THE INVENTION

1. Field of the Invention

The present invention relates to a semiconductor apparatus comprising a plurality of wiring layers, a method of manufacturing the semiconductor apparatus, and a wiring device for the semiconductor apparatus.

2. Description of the Related Art

In a semiconductor apparatus in which a plurality of transistors is mounted, variations in its property and structure more remarkably affect a drive performance of each transistor as miniaturization is advanced. Examples of the variations include a variation resulting from a fluctuation of a power-supply voltage and a variation in manufacturing the transistors, which largely changes the drive performance of each transistor. Such problems is generated due to the foregoing disadvantage that a device which satisfied timing restrictions in a designing stage and was expected to normally operate consequently fails to satisfy the timing restrictions when actually manufactured, and as a result, is unable to execute any desired operation.

In order to avoid such a design error, it is important to secure a sufficient design margin in consideration of the variations when the semiconductor apparatus is manufactured. There is a hold time of a flip-flop as an example of the design margin, which is a minimum time length in which a data signal must be retained after a clock signal is inputted to the flip-flop. If it is not possible to retain the data signal during the minimum time length, the flip-flop consequently retains incorrect data, which causes a malfunction. Therefore, it is necessary to take account of the design margin (hold time in this case) so that correct data can be retained in the flip-flop even though the drive performance of the transistor is varied due to the foregoing variations so that arrival times of the clock and data are changed.

FIG. 15 shows a conventional semiconductor apparatus 1000. The semiconductor apparatus 1000 comprises flip-flops 1010 and a scan chain 1020 for implementing a scan test. A reference symbol SI denotes a terminal of the flip-flop 1010 for retrieving scan data. As recited in No. 2004-301661 of the Japanese Patent Applications Laid-Open, a wiring layer having a resistance value per unit length higher than that of a wring layer in which a wiring of the clock signal is formed is adopted for the scan chain 1020 in order to satisfy the hold time at the SI terminal.

Even though a signal propagation time in the scan chain 1020 that connects the flip-flops provided in vicinity to each other is changed due to the before-mentioned variations, the hold time in the SI terminal can be thereby satisfied as a sufficient delay value is obtained by use of the higher-resistance wiring.

However, it is inadequate to provide the wiring layer having the higher resistance value per unit length in such a signal line where a critical signal speed is demanded. In order to deal with the disadvantage, it is necessary that the higher-resistance wiring layer is formed so as to avoid such a signal line.

According to the foregoing method, however, connection spots are increased with respect to wiring layers located up and down the higher-resistance wiring layer, and thereby congestion of the wirings is generated. When the wirings are congested, circumvention of the wirings or crosstalk between the adjacent wirings each other is generated, which makes it impossible to satisfy the timing restrictions in the signal line in which the critical signal speed is demanded. As a result, it becomes difficult to operate the semiconductor apparatus at a desired operation frequency.

SUMMARY OF THE INVENTION

Therefore, a main object of the present invention is to satisfy timing restrictions in a signal line in which a critical signal speed is demanded, and thereby facilitate an operation of a semiconductor apparatus at a desired operation frequency.

In order to achieve the foregoing object, a semiconductor apparatus according to the present invention comprises multilayered wiring layers, wherein at least one of the wiring layers comprises a first wiring and a second wiring, and the first wiring and the second wiring respectively have different sheet resistance values.

According to the present invention, the wiring having the lower resistance value and the wiring having the higher resistance value are provided in the same wiring layer so that congestion of the wirings is made difficult to take place in comparison to the conventional semiconductor apparatus.

In a preferable mode of the present invention, the first and second wirings consist of a material capable of being connected to a material of the other wirings.

According to another preferable mode of the present invention, the semiconductor apparatus further comprises a plurality of data memory devices and a plurality of logic circuit elements, wherein the sheet resistance value of the first wiring is higher than the sheet resistance value of the second wiring, the first wiring constitutes a signal line for connecting the data memory devices to each other, and at most three logic circuit elements are connected to the first wiring.

The data memory device is not limited to a flip-flop, and any device or circuit capable of memorizing data can be used. An example of the device is a latch circuit. The logic circuit element is not limited to a buffer element, and any element that can constitute the logic circuit can be used. An example of the device is an inverter.

According to the foregoing constitution, the hold-time restrictions can be satisfied by only use of the high-resistance wiring. In a semiconductor apparatus comprising only the wirings made of the small-resistance material, it is necessary to adjust delays (adjustment of increase) by inserting a buffer element or the like at any part where the hold-time restrictions are not satisfied. In the present invention, the adjustment of the delays can be carried out by only use of the wiring made of the material having the high resistance value. Therefore, increase of parts due to insertion arrangement of the buffer element can be prevented, and increase of power consumption in the semiconductor apparatus can be controlled.

In the semiconductor apparatus comprising only the wirings made of the small-resistance material, it is necessary to adjust the delays by routing around the wiring at the part where the hold-time restrictions are not satisfied in a long distance. In the present invention, the adjustment of the delays can be carried out with only the use of the wiring made of the material having the high resistance value, which eliminates the need to change the wiring path. The constitution of the present invention, therefore, can prevent any change in an inter-wiring capacitance between the relevant wiring and the other wirings due to routing of the wiring, and any correction necessary for satisfying the hold-time restrictions can be made without generating timing variations in the other wirings.

A preferable mode of the present invention further comprises a plurality of data memory devices each having a scan function, wherein the sheet resistance value of the first wiring is higher than the sheet resistance value of the second wiring, and a scan chain wiring connecting the data memory devices to each other consists of the first wiring.

An another preferable mode of the present invention further comprises two data memory devices operating at different clock frequencies in a normal operation but operating at an identical frequency in a scan mode, wherein the sheet resistance value of the first wiring is higher than-the sheet resistance value of the second wiring, and a signal line connecting the data memory devices to each other consists of the first wiring According to these preferable modes, in the case where it is difficult to secure a region where the buffer element is inserted or the wiring is extended around in the part where the data memory devices are provided in vicinity and the hold-time restrictions are not satisfied, the hold-time restrictions can be satisfied by only change to the high-resistance wiring.

An another preferable mode further comprises first and second integrated circuit blocks, wherein the sheet resistance value of the second wiring is lower than the sheet resistance value of the first wiring, and the second wiring constitutes a signal line connecting the first and second integrated circuits to each other.

Accordingly, a delay time between the integrated circuit blocks can be reduced by constituting a wiring with a strict timing between the integrated circuit blocks with the material having the low resistance value.

An another preferable mode further comprises a memory cell having an access transistor and a word line for turning on/off the access transistor, wherein the sheet resistance value of the second wiring is lower than the sheet resistance value of the first wiring, and the second wiring constitutes the word line.

Accordingly, a wiring resistance of the word line is reduced, and a timing to open a gate of the access transistor is thereby faster. As a result, data can be more speedily read from the data memory device.

An another preferable mode further comprises a memory cell for retaining data and a bit line to which the memory cell is connected, wherein the sheet resistance value of the second wiring is lower than the sheet resistance value of the first wiring, and the second wiring constitutes the bit line.

Accordingly, a wiring resistance of the bit line is reduced, and data read with respect to the memory cell and a precharge/discharge operation of the bit line can be executed at higher speeds. As a result, a higher speed operation can be realized in the data memory device.

An another preferable mode further comprises a clock wiring, wherein the sheet resistance value of the second wiring is lower than the sheet resistance value of the first wiring, and the second wiring constitutes the clock wiring.

Accordingly, a resistance value of the clock wiring can be reduced, which lead to control a variation in the propagation of the clock signal as a result of reduction of latency in the clock wiring. Further, as the clock signal can precipitously rise and fall, reduction of a leakage current and improvement of an operation frequency in the semiconductor apparatus can be realized.

An another preferable mode further comprises a power-supply wiring, wherein the sheet resistance value of the second wiring is lower than the sheet resistance value of the first wiring, and the second wiring constitutes the power-supply wiring.

Accordingly, as an IR drop in the power-supply wiring can be controlled, power can be stably supplied to the transistor provided in the semiconductor apparatus so as to stabilize the operation of the semiconductor apparatus.

In the foregoing constitution, the power-supply wiring is preferably a power-supply wiring of an analog circuit. Accordingly, an operation of the analog circuit can be stabilized by constituting the power-supply wiring arranged from the analog circuit until an IO pad with the low-resistance material.

An another preferable mode further comprises a diffusion layer, wherein a part or all of the first wiring or the second wiring is not connected to the diffusion layer.

Accordingly, a material unusable as the wiring of the signal line due to its high resistance value but having a low unit price can constitute a wiring which is provided without connecting to the diffusion layer in a wiring layer in order to control an area ratio of the wiring per unit area to set in a regulated value. As a result, a manufacturing cost of the semiconductor apparatus can be reduced.

In a different view, a semiconductor apparatus comprises multilayered wiring layers and a contact for connecting the opposing wiring layers, wherein the contact comprises a first contact and a second contact, and the first contact and the second contact have different sheet resistance values respectively.

The semiconductor apparatus according to the present invention can be manufactured by means of a manufacturing method including a step of etching an inter-layer insulation film to form a first groove and embedding a first material having a conductivity in the first groove, and a step of etching an area of the inter-layer insulation film other than the first groove to form a second groove and embedding a second material having a sheet resistance value different from a sheet resistance value of the first material and the conductivity in the second groove.

Furthermore, the semiconductor apparatus according to the present invention can be manufactured by means of a manufacturing method including a step of spraying the first material having the conductivity on a plane along a first layout pattern so as to thereby form the first layout pattern made of the first material, a step of spraying the second material having the sheet resistance value different from the sheet resistance value of the first material and the conductivity on the plane along a second layout pattern so as to thereby form the second layout pattern made of the second material, and a step of spraying an insulator on the plane so as to thereby form an insulation film for insulating the first and second layout patterns from each other.

According to the foregoing manufacturing methods, the semiconductor apparatus of the present invention can be manufactured wherein the wirings having the different sheet resistance values are provided in a wiring layer.

A wiring method for a semiconductor apparatus according to the present invention includes a step of extracting a part where violation to a hold time is caused from the semiconductor apparatus, a step of calculating how much a wiring resistance value should be increased in order to dice away the part where violation to a hold time is caused, and a step of changing a material used for the wiring from a material having a low resistance value to a material having a high resistance value so as to be equal to a result of the calculation on how much the resistance value is increased. Accordingly, information can be outputted so that the error of the hold time can be improved by only change of the material constituting the wiring.

A wiring method for a semiconductor apparatus according to the present invention includes a step of extracting a part where violation to a hold time is caused in a semiconductor apparatus having an electronic circuit device and a wiring connected to the electronic circuit device, a step of calculating an increase amount of a resistance value in an arbitrary part of the wiring required for dissolving the violation of the hold time in the part, and a step of changing a material constituting the arbitrary part of the wiring from a material having a low resistance value to a material having a high resistance value in accordance with a result of the calculation of the increase amount of the resistance value in the arbitrary part of the wiring.

A wiring method for a semiconductor apparatus according to the present invention includes a step of extracting a part where violation to a set-up time is caused in a semiconductor apparatus having an electronic circuit device and a wiring connected to the electronic circuit device, a step of calculating an descent amount of a resistance value in an arbitrary part of the wiring required for dissolving the violation to the set-up time in the part, and a step of changing a material constituting the arbitrary part of the wiring from a material having a high resistance value to a material having a low resistance value in accordance with a result of the calculation on the descent amount of the resistance value in the arbitrary part of the wiring.

According to the foregoing wiring methods, various wiring design information can be outputted so that a set-up error can be improved by only change of the material constituting the wiring.

The present invention is useful for a semiconductor apparatus aiming a higher integration because the wiring delay can be adjusted without the generation of the wiring congestion.

The present invention is useful for a semiconductor apparatus in which a highly accurate timing control is demanded because the two wirings having the different sheet resistances can be formed in one wiring layer.

The present invention is useful for a semiconductor apparatus in which a miniaturized process design is demanded because the delay value of the arbitrary wiring can be changed without any influence on the timings of the other wirings.

BRIEF DESCRIPTION OF THE DRAWINGS

These and other objects as well as advantages of the invention will become clear by the following description of preferred embodiments of the invention. A number of benefits not recited in this specification will come to the attention of the skilled in the art upon the implementation of the present invention.

FIGS. 3A-3B are timing charts according to the preferred embodiment 1.

FIG. 4 is a stereoscopic view of a semiconductor 25 apparatus according to a preferred embodiment 2 of the present invention.

FIG. 7 is a plan view of the semiconductor apparatus according to the preferred embodiment 2.

FIG. 8 is a plan view of a semiconductor apparatus according to a preferred embodiment 3 of the present invention.

FIG. 9 is a stereoscopic view of a semiconductor apparatus according to a preferred embodiment 4 of the present invention.

FIGS. 10A-10E are process drawings of a method for manufacturing a semiconductor apparatus according to a preferred embodiment 5 of the present invention.

FIG. 15 is a plan view of a semiconductor apparatus according to a conventional technology.

DETAILED DESCRIPTION OF THE INVENTION

Figure 1:
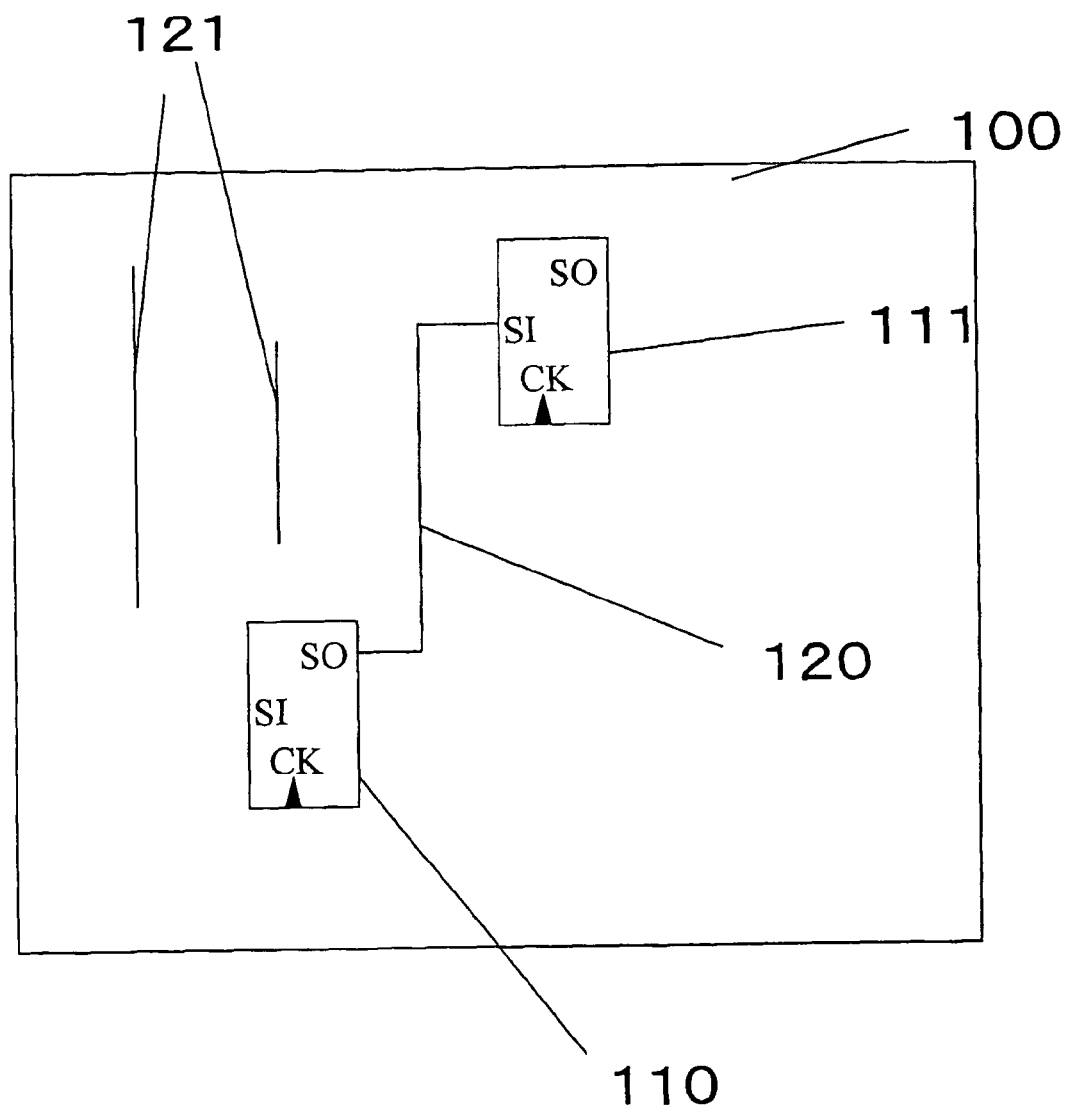
FIG. 1 is a plan view of a semiconductor apparatus according to a preferred embodiment 1 of the present invention.

Hereinafter, preferred embodiments of the present invention are described referring to the drawings.

PREFERRED EMBODIMENT 1

FIG. 1 is a plan view of a semiconductor apparatus 100 according to a preferred embodiment 1 of the present invention. The semiconductor apparatus 100 has a multi-layered wiring layers, and comprises flip-flops with scan function (data memory devices) 110 and 111, a wiring (scan chain wiring) 120 for connecting the flip-flops 110 and 111 constituting the scan chain and a signal wiring 121 as shown in the drawing. The flip-flops 110 and 111 comprises a clock terminal CK, a scan data input terminal SI and a scan data output terminal SO respectively. The flip-flops 110 and 111 are connected at a longitudinal continuation so as to operate as scan registers of a shift-register type in the case where a scan path test method, which is an example of a method to facilitate a function test for a semiconductor apparatus, is implemented. Accordingly, the flip-flops 110 and 111 constitute the scan chain.

Figure 2:
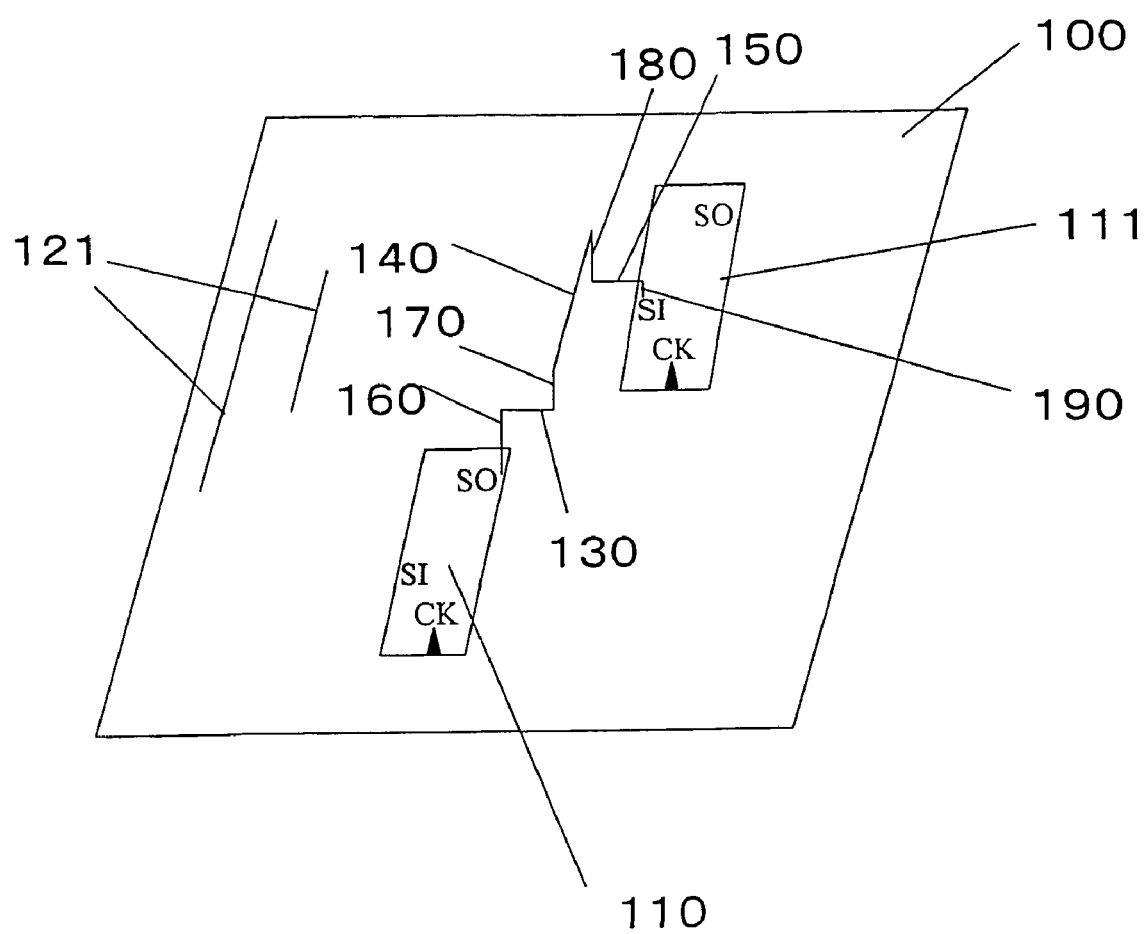
FIG. 2 is a stereoscopic view of the semiconductor apparatus according to the preferred embodiment 1.

FIG. 2 shows the scan chain wiring 120 shown in FIG. 1 in a three-dimensional manner. The scan chain 120 comprises wirings 130, 140 and 150, and contacts 160, 170, 180 and 190. The wiring 140 (first wiring) and the signal wiring 121 (second wiring) are provided in a first wiring layer. The first wiring layer is pattern-formed on a plane of the semiconductor apparatus. The wirings 130 and 150 are provided in a second wiring layer. The second wiring layer is pattern-formed on another plane of the semiconductor apparatus. The first wiring layer is provided on the plane above the plane in which the second wiring layer is formed. In order to satisfy a hold time of the SI terminal of the flip-flop 111, metal having a sheet resistance value higher than that of the signal wiring 121 constitutes the wiring 140 in the preferred embodiment 1.

FIGS. 3A and 3B show timing charts of the flip-flop 111. Because the scan chain generally connects the SO terminal and the SI terminal of the flip-flops provided in vicinity, a delay time resulting from the wirings is thereby remarkably shortened and it often happens that hold-time restrictions are not satisfied at the SI terminal.

FIG. 3A shows data in the case where metal having a low sheet resistance value constitutes the wiring 140 (first wiring) FIG. 3B shows data in the preferred embodiment 1 wherein metal having a high sheet resistance value constitutes the wiring 140 (first wiring). In FIG. 3A, the hold-time restrictions are not satisfied because a signal reaches the SI terminal too early in comparison to a clock signal reaching the CK terminal of the flip-flop 111. In contrast, in FIG. 3B, a propagation delay is increased in the scan chain 120 by constituting the wiring 140 (first wiring) with the metal having the high sheet resistance value, and the signal reaches the SI terminal of the flip-flop 111 later than the clock signal reaching the CK terminal of the flip-flop 111. As a result, the restrictions of the desirable hold time can be satisfied. Tungsten is suitable as the metal having the higher sheet resistance value in use as the wiring 140 (first wiring). Copper having a low sheet resistance value is suitable as a material used for the signal wiring 121 (second wiring). The combination of the material having the high sheet resistance value and the material having the low sheet resistance value is not necessarily limited to tungsten and copper.

Figure 13:
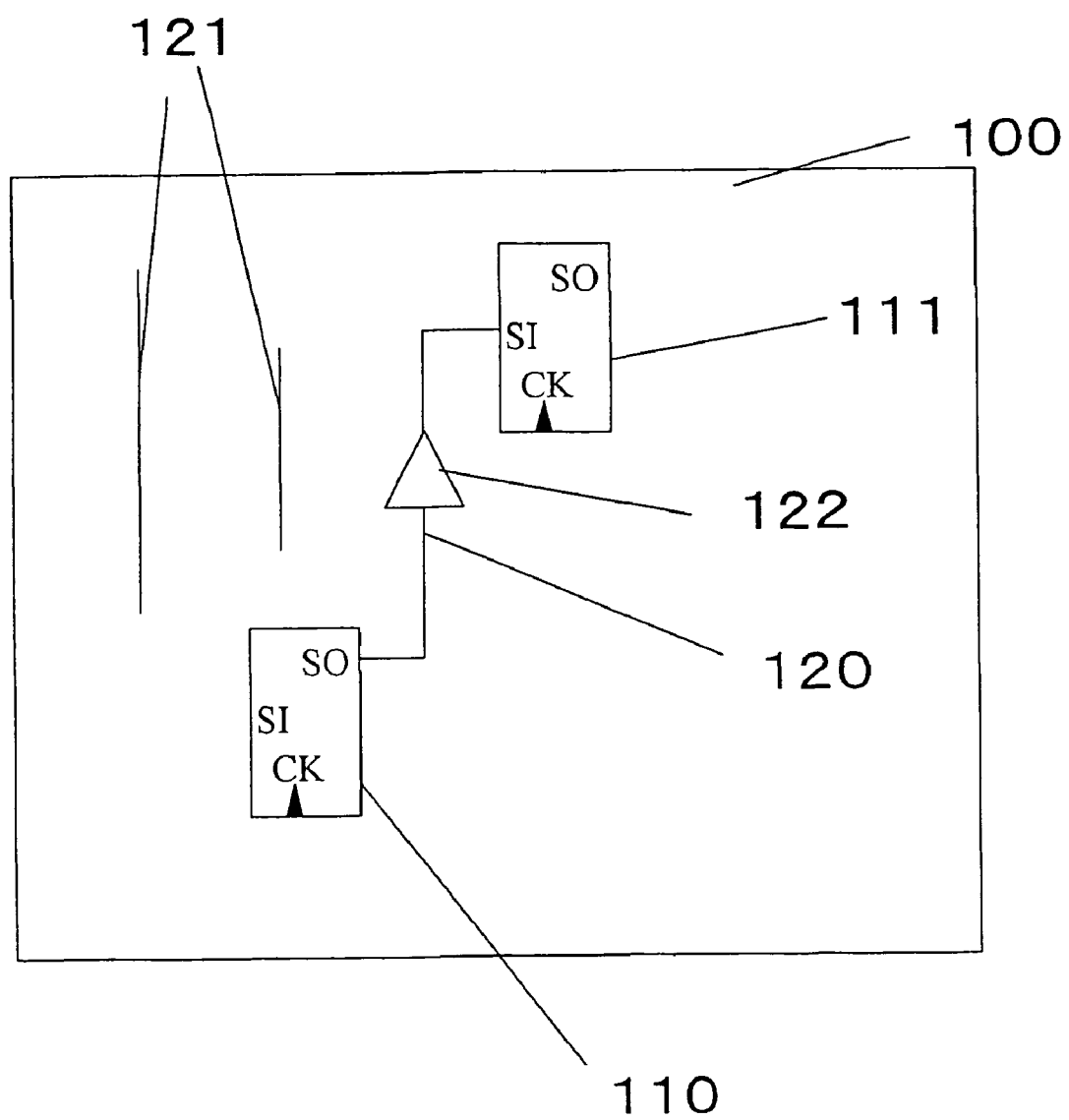
FIG. 13 is a plan view showing an example in which a buffer element is provided in the preferred embodiment 1.
Figure 14:
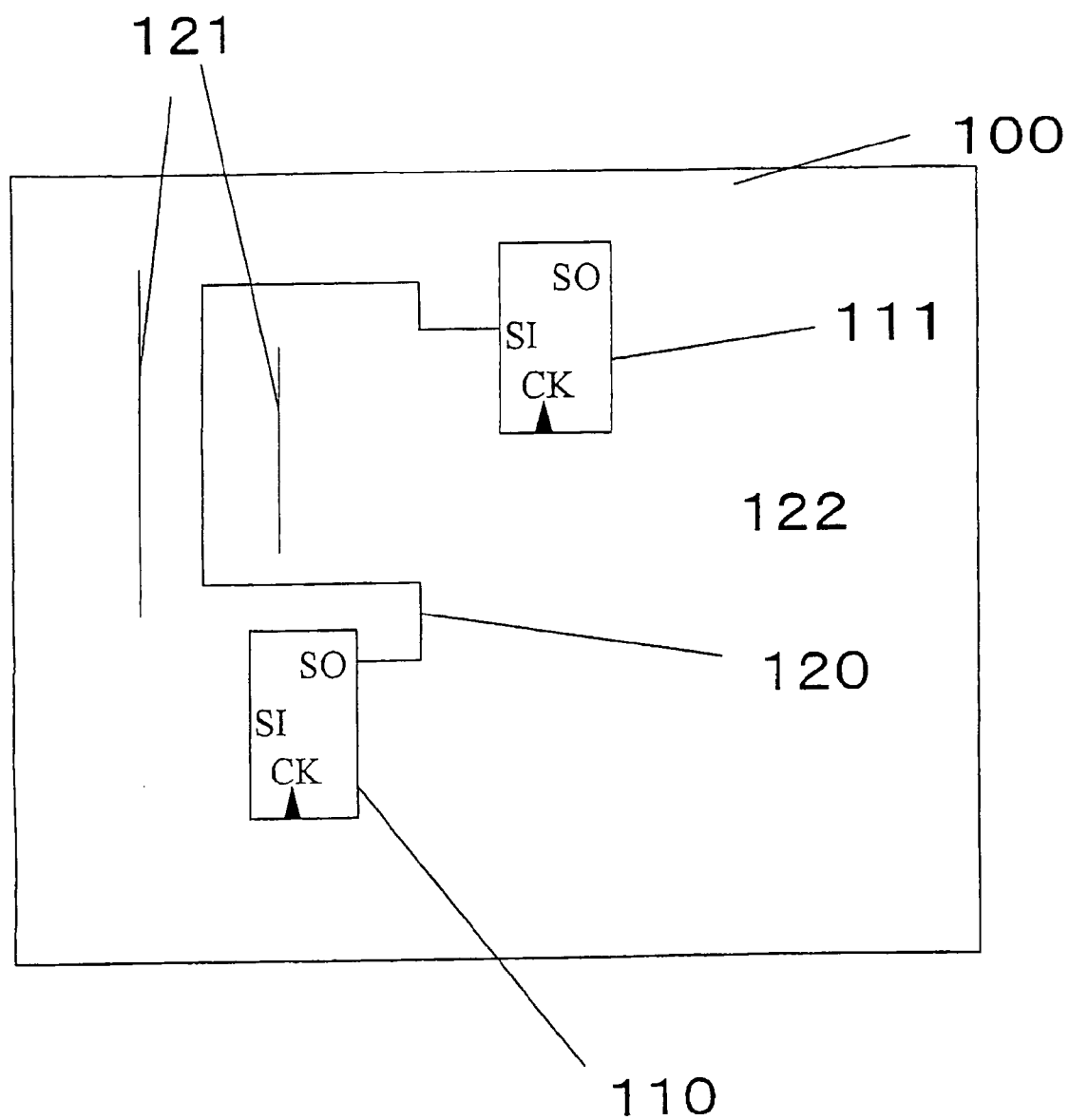
FIG. 14 is a plan view showing an example in which wirings are extended around in the preferred embodiment 1.

As examples of a constitution for adjusting the delay amount, at most three buffer elements (logic circuit elements) 122 may be inserted into the signal line 120 which connects the flip-flops (data memory devices) 110 and 111 to each other as shown in FIG. 13, or the wirings may be extended around as shown in FIG. 14. There is a harmful effect such as increase of power consumption in the structure where the buffer element 122 is inserted. There is a harmful effect that an inter-wiring capacitance is changed due to the change of the wiring path so as to thereby change timings of the other signal lines in the structure where the wiring is extended around. On the contrary, in the constitution according to the preferred embodiment 1 (high resistance structure of the wring), the material used for the wiring (first wiring) 140, which is a part of the wirings where the delay amount is desirably adjusted, is replaced with the material having the high sheet resistance value. As a result, the delay amount can be easily adjusted without any influence on the other wirings.

Additionally, the constitution such as insertion of the buffer element or the extension of the wiring may be combined with the constitution according to the preferred embodiment 1 (wiring resistance is increased). In the preferred embodiment 1, wherein the scan chain was described, an effect to similar to that of the preferred embodiment 1 can be obtained in such a manner that the wiring which connects the flip-flop (data memory device) and the buffer element (logic circuit element) or the wiring which connects the buffer elements (logic circuit elements) to each other is regarded as the first wiring, and the material having the high sheet resistance constitutes the first wiring in a part where not more than three buffer elements (logic circuit elements) are inserted in order to connect the flip-flops (data memory devices) provided in vicinity and the hold-time restrictions cannot be satisfied.

In the preferred embodiment 1, the metal having the high sheet resistance constitutes only a single wiring layer, however, the metal having the higher sheet resistance may constitute a plurality of wiring layers in a similar manner.

PREFERRED EMBODIMENT 2

FIG. 4 is a plan view of a semiconductor apparatus 200 according to a preferred embodiment 2 of the present invention. The semiconductor apparatus 200 has the multi-layered wiring layers, and comprises a first integrated circuit block 210, a second integrated circuit block 211, a first wiring 220, and a second-wiring 221 as shown in the drawing. The first wiring 220 and the second wiring 221 connect the first integrated circuit block 210 and the second integrated circuit block 211. The first and second wirings 220 and 221 are wired as a part of the wiring layers on a same plane in a region a-a'. The region a-a' is a region located between the integrated circuits 210 and 211.

Figure 5:
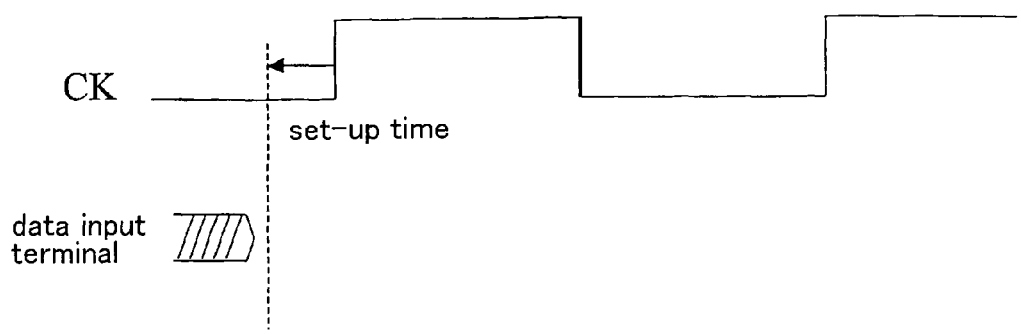
FIG. 5 is a timing chart according to the preferred embodiment 2.

In general, wirings which connect the integrated circuit blocks to each other are wired in an extended length, and the wirings are often in parallel with each other. Therefore, the propagation delay in the wirings is increased depending on the wiring resistance or inter-wiring capacitance, and thereby, it sometimes happen not to satisfy a set-up time required for the semiconductor apparatus. The set-up time is a minimum time length during which the data signal must be decided before the clock signal is inputted to the flip-flop. The flip-flop consequently retains incorrect data unless the data signal is decided within the minimum time length, and a malfunction may be thereby caused. FIG. 5 is a timing chart of the set-up time at the data input terminal of the flip-flop.

The second wiring 221 particularly connects the elements to each other wherein set-up timing of them are strict. In the preferred embodiment 2, metal having a sheet resistance value lower than that of the first wiring 220 constitutes the second wiring 221 in the region a-a'. Thereby, the propagation delay of the second wiring 221 is made smaller than that of the first wiring 220. In the preferred embodiment 2, aluminum is used as a material of the first wiring 220, and copper is used as a material of the second wiring 221. The combination of the material having the high sheet resistance value and the material having the low sheet resistance value is not limited to aluminum and copper.

According to the constitution as described above, the second wiring 221 formed from the metal having the low sheet resistance value is provided in the region a-a' so that the propagation delay between the integrated circuit block 210 and the integrated circuit block 211 can be reduced. Thereby, the set-up time required for the semiconductor apparatus 200 can be satisfied. In the preferred embodiment 2, though the wiring between the integrated circuit blocks 210 and 211 in which the timing is strict was described, a similar constitution may be adopted in any other part where the delay value is required to reduce and a similar effect can be also obtained in such case.

PREFERRED EMBODIMENT 3

Figure 6:
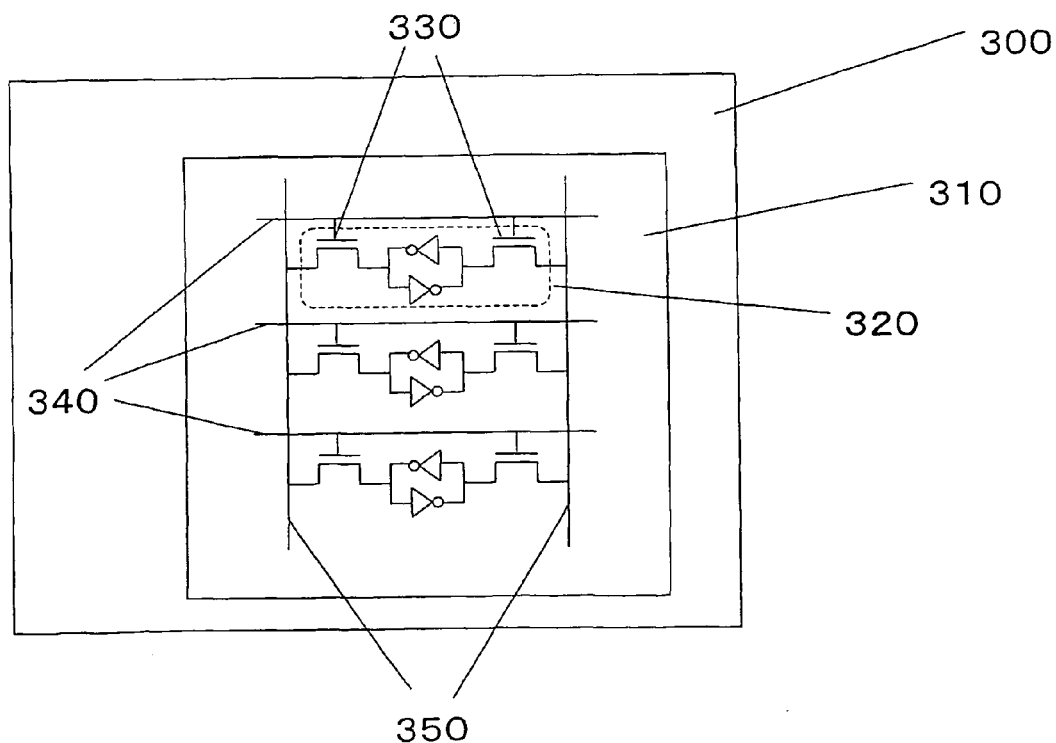
FIG. 6 is a plan view of the semiconductor apparatus according to the preferred embodiment 2.

FIG. 6 shows a memory macro 310 mounted in a semiconductor apparatus 300. The memory macro 310 comprises a plurality of memory cells 320 for retaining data. Each of the memory cells 320 comprises a plurality of access transistors 330. In the preferred embodiment 3, a word line 340 for turning on and off the access transistors 330 and a bit line 350 for reading data from the memory cells 320 are regarded as the second wiring, and other wirings in the same wiring layer are regarded as the first wiring. Then, the word line 340 and the bit line 350 (second wiring) consists of metal having a sheet resistance value lower than that of the other wiring (first wiring).

As the word line 340 generally has an long wiring length, a wiring having a low resistance is required as the word line 340 in order to perform ON/OFF control of the access transistors 330 at a high speed in such an long wiring. Further, the bit line 350 also generally has an long wiring length and is connected to a large number of memory cells in such a long wiring so that data is read at a high speed. Therefore, a wiring having a low resistance is necessary as the bit line 350. The data can be read at a high speed from the memory macros 310 by reducing the resistances of the word line 340 and the bit line 350 as described in the present preferred embodiment.

PREFERRED EMBODIMENT 4

In a preferred embodiment 4 of the present invention, a clock wiring 420 for supplying a clock signal to a flip-flop 410 of a semiconductor apparatus 400 is the second wiring, and other wirings in the same wiring layer are the first wiring as shown in FIG. 7. Then, metal having a sheet resistance value lower than that of the other wirings (first wiring) in the same wiring layer constitutes the clock wiring 420 (second wiring) so that a signal waveform of the clock signal can precipitously rise and fall. Thereby, it can be achieved that a leakage current of the semiconductor apparatus is reduced.

PREFERRED EMBODIMENT 5

FIG. 8 is a plan view showing a semiconductor apparatus 500 according to a preferred embodiment 5 of the present invention. The semiconductor apparatus 500 is provided with multi-layered wiring layers, and comprises a power-supply wiring 510 and an integrated circuit block 520.

Power source is supplied to the integrated circuit block 520 from the power-supply wiring 510 via an IO pad (not shown in FIG. 8) from outside of the semiconductor apparatus 500. A signal wiring 530 is also provided in the wiring layer in which the power-supply wiring 510 is provided. In the preferred embodiment 5, the power-supplywiring510 constitutes the second wiring, and metal having a sheet resistance value lower than that of the other signal wiring 530 (first wiring) constitutes the power-supply wiring 510. In the preferred embodiment 5, the power-supply wiring 510, which is the second wiring, is formed from copper, while the signal wiring 530, which is the first wiring, is formed from aluminum.

The combination of the material having the high sheet resistance value and the material having the low sheet resistance value is not limited to aluminum and copper.

In the preferred embodiment 5 wherein the resistance value of the power-supply wiring 510 is reduced in the foregoing constitution, even if such an accident that a large current is momentarily consumed in a part of the integrated circuit block 520, a voltage variation in the power-supply wiring 510 can be controlled to a small level so as to stabilize the operation of the semiconductor apparatus 510.

PREFERRED EMBODIMENT 6

In the preferred embodiment 5, the power-supply wiring 510 to supply the power to the integrated circuit block 520 was described. In a preferred embodiment 6 of the present invention, the integrated circuit block 520 is used as an analog circuit 520 installed in the semiconductor apparatus, and the power-supply wiring 510 for supplying power to the analog circuit 520 is regarded as the second wiring. Then, metal having a sheet resistance value lower than that of the other wirings (first wiring) constitutes the power-supply wiring 510.

The power supply of the analog circuit installed in the semiconductor apparatus together with a digital circuit is separated from a power supply of the digital circuit and the power supply is wired to be connected to the analog circuit via the IO pad. The reason is because it is generally desired that the power is supplied to the power supply of the analog circuit in such a manner that a noise from the digital circuit is avoided and there is no voltage drop from the IO pad.

PREFERRED EMBODIMENT 7

The wirings are described in the preferred embodiments 1-6, and the similar descriptions can be applied to the contacts. For example, the delay may be obtained by constituting the first contact 170 with metal having a sheet resistance value higher than that of the second contact 180 in FIG. 2.

PREFERRED EMBODIMENT 8

FIG. 9 is a plan view showing a semiconductor apparatus 600 comprising a plurality of wiring layers according to a preferred embodiment 8 of the present invention. The semiconductor apparatus 600 comprises multi-layered wiring layers. FIG. 9 shows a plan view wherein only a wiring layer 610 among the plurality of wiring layers is observed from above. As shown in FIG. 9, the wiring layer 610 comprises a signal wiring 620 as the second wiring and a first wiring 630 that is not electrically connected to a diffusion layer. The first wiring 630 is provided so that an area ratio of the wirings per unit area in an entire area of the wiring layer 610 stays within a regulated value when the wiring layer 610 is observed from above. Grooves can be evenly cut in etching and the manufacturing variation can be controlled by providing the first wiring 630 so that the area ratio of the wirings stays within the regulated value.

Conventionally, a large deviation is generated in coarse or thick state of the wirings in the semiconductor apparatus depending on the structure of the circuits arranged. In order to control the structural variation (wiring density) generated when the semiconductor apparatus is manufactured, the first wiring 630 is provided in the preferred embodiment 8. The first wiring 630 is formed from metal more inexpensive than the material used for the signal wiring 620 that is a second wiring. Therefore, in a preferred embodiment 8, cost reduction can be realized since the wiring layer 610 is formed from the inexpensive metal.

PREFERRED EMBODIMENT 9

FIGS. 10A-10B respectively show a method of manufacturing a semiconductor apparatus 700 comprising a plurality of wiring layers in a preferred embodiment 9 of the present invention. In the manufacturing method, first and second wirings are formed as a wiring layer on an arbitrary plane of the semiconductor apparatus 700. First, contacts 710 and 740 for inter-layer connection are formed in an inter-layer insulation film 701 located on a layer below the wiring layer constituting the first and second wirings as shown in FIG. 10A. The contact 710 is formed at a part connected to the first wiring. The contact 740 is formed at a part connected to the second wiring. Next, the inter-layer insulation film 701 is formed further on an upper layer of the inter-layer insulation film 701 in which the contacts 710 and 740 are formed, and a first groove 720 is formed in the inter-layer insulation film 701 on the upper layer side by means of etching or the like. A shape of the first groove 720 corresponds to a shape of a wiring pattern of a first wiring 730. A part of the groove shape is arranged on the upper side of the contact 710 so as to abut the contact 710, and the contact 710 is thereby exposed at a bottom section of the first groove 720. Next, as shown in FIG. 10B, the first groove 720 is filled with a first material made of copper so that the first wiring 730 is formed. The first wiring 730 is connected to the contact 710 so as to abut the contact 710.

Next, a second groove 750 is formed in the inter-layer insulation film 701 by means of etching or the like. A shape of the second groove 750 corresponds to a shape of a wiring pattern of a second wiring 760. A part of the groove shape is arranged on the upper side of the contact 740 so as to abut the contact 740, and the contact 740 is thereby exposed at a bottom section of the second groove 750. Next, as shown in FIG. 10D, the second groove 750 is filled with a second material made of aluminum having a sheet resistance value higher than that of copper so that the second wiring 760 is formed. The second wiring 760 is connected to the contact 740 so as to abut the contact 740.

Finally, as shown in FIG. 10E, a planarization process or the like is applied to the inter-layer insulation film 701 in which the first and second wirings 730 and 760 are provided, and thereafter, an insulation film 770 is formed further on the upper side of the inter-layer insulation film 701.

According to the method of manufacturing the semiconductor apparatus as mentioned above, the first and second wirings 730 and 760 having the different sheet resistance values can be formed in the same wiring layer. Therefore, the wirings are formed by changing the metal to be the wirings in accordance with a purpose such as the case where it is desired that the wiring delay is freely adjusted on the increase side or decrease side. As a result, a desirable delay value can be obtained.

In the preferred embodiment 9, copper and aluminum is used as the metals for the first and second wirings, however, different metals may be combined. In the preferred embodiment 9, description is given to the method of manufacturing the wirings in the semiconductor apparatus, it can be applied to a method of manufacturing the contacts.

PREFERRED EMBODIMENT 10

Figure 11C:
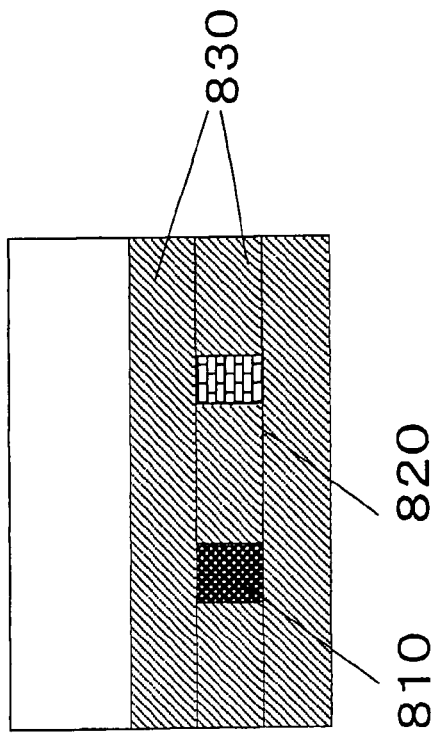
FIGS. 11A-11C are process drawings of a method for manufacturing a semiconductor apparatus according to a preferred embodiment 6 of the present invention.
Figure 11A:
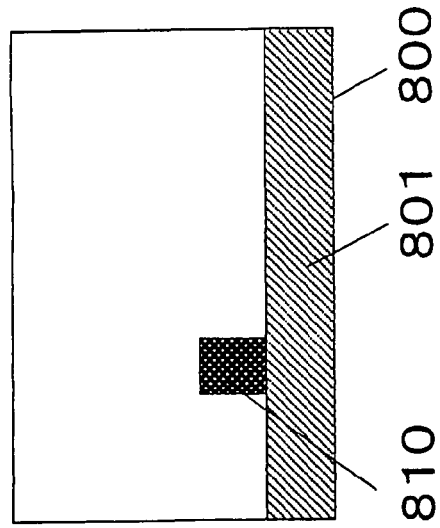
Figure 11B:
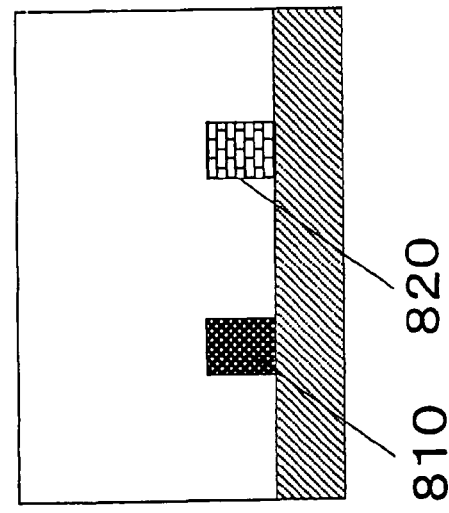

FIGS. 11A-11C respectively show a method of manufacturing a semiconductor apparatus 800 comprising a plurality of wiring layers described in a preferred embodiment 10 of the present invention. According to the manufacturing method, first and second wirings are formed as a wiring layer on an arbitrary plane of the semiconductor apparatus 800. First, as shown in FIG. 11A, a second material made of copper is sprayed on an upper surface of an inter-layer insulation film 801 located in a layer below the wiring layer constituting the first and second wirings so that a second wiring 810 is formed.

Next, as shown in FIG. 11B, a first material made of tungsten having a sheet resistance value higher than that of copper is sprayed on the upper surface of the inter-layer insulation film 801 so that a second wiring 820 is formed.

Finally, as shown in FIG. 11C, an insulator is sprayed on the inter-layer insulation film 801 on which the first and second wirings 810 and 820 are formed so that an insulation film 830 for insulating the first and second wirings 810 and 820 from each other is formed.

According to the method of manufacturing the semiconductor apparatus, the first and second wirings 810 and 820 having the different sheet resistance values can be formed in the same wiring layer. Therefore, the wirings are formed by changing the metal to become the wirings in accordance with a purpose such as the case where it is desired that the wiring delay is freely adjusted on the increase side or decrease side. As a result, a desirable delay value can be obtained.

In the preferred embodiment 10, copper and tungsten is used as the metals for the first and second wirings, however, different metals may be combined. Though description is given to the method of manufacturing the wirings in the semiconductor apparatus in the preferred embodiment 10, it can be applied to a method of manufacturing the contacts.

PREFERRED EMBODIMENT 11

Figure 12:
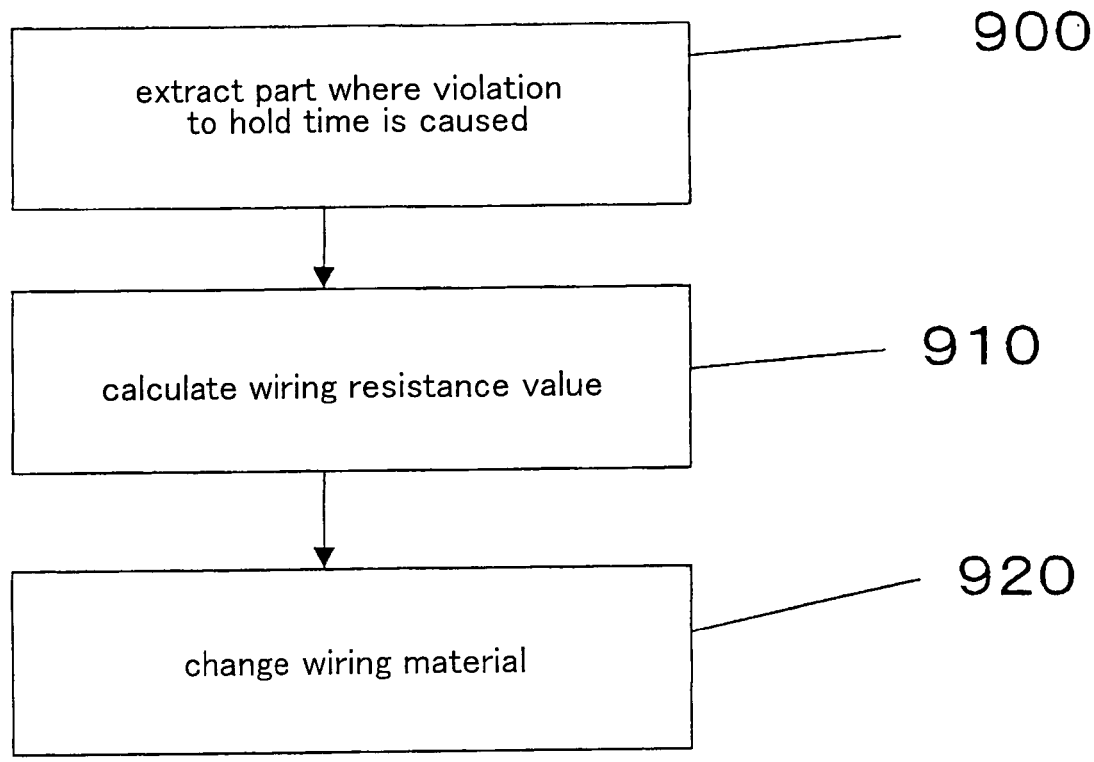
FIG. 12 is a process drawing of a method for manufacturing a semiconductor apparatus according to a preferred embodiment 7 of the present invention.

FIG. 12 shows a flow chart of a wiring method implemented in a wiring device wherein a material of a wiring at a part where the hold time is not satisfied can be changed in a semiconductor apparatus comprising a plurality of wiring layers according to a preferred embodiment 11 of the present invention. As shown in FIG. 12, Step 900 for extracting the part where violation to the hold time is caused from the semiconductor apparatus is executed. Next, Step 910 for calculating a declination amount of a resistance value in an arbitrary part of the wirings that is required for dissolving the set-up time violation in the relevant part is executed. Finally, Step 920 for changing a member constituting the arbitrary part of the wirings from a material having a high sheet resistance value to a material having a low sheet resistance value is executed in accordance with a result of the calculation of the declination amount of the resistance value in the arbitrary part of the wirings.

The semiconductor apparatus in which the wiring material is changed according to the wiring method comprises the wirings having the different sheet resistance values in a wiring layer. According to the wiring device mentioned above, the wiring in a part where it is desirable that the wiring resistance is obtained can be easily changed without any influence on the timings of the other wirings.

Though description is given to the change of the wiring at the part where it is desirable that the enough wiring delay is obtained, it can be applied to a wiring device for changing a wiring at a part where it is desirable that the wiring delay is reduced, from a wiring having a high sheet resistance value to a wiring having a low sheet resistance value.

Though the preferred embodiments of this invention is described in detail, it will be understood that various modifications may be made therein, and it is intended to cover in the appended claims all such modifications as fall within the true spirit and scope of this invention.

What is claimed is:

1. A semiconductor apparatus comprising multi-layered wiring layers, the multi-layered wiring layers comprising:
    a first wiring layer;
    a second wiring layer;
    a first contact for connecting the first wiring layer and the second wiring layer;
    a second contact for connecting the first wiring layer and the second wiring layer;
    wherein the first wiring layer and the second wiring layer are different layers arranged one above the other, and the first contact and the second contact have different sheet resistance values respectively.

2. The semiconductor apparatus according to claim 1, wherein the first and second contacts are constituted with a material which can be connected to the wiring layer.

3. The semiconductor apparatus according to claim 1, further comprising:
    a plurality of data memory devices; and
    a plurality of logic circuit elements,
    wherein the data memory devices are connected via a signal line, the sheet resistance value of the first contact is higher than the sheet resistance value of the second contact, the first contact is provided on the signal line, and at most three logic circuit elements are connected to the signal wiring.

4. The semiconductor apparatus according to claim 1, further comprising a plurality of data memory devices having a scan function, wherein the sheet resistance value of the first contact is higher than the sheet resistance value of the second contact, and the first contact constitutes a scan chain wiring for connecting the data memory devices.

5. The semiconductor apparatus according to claim 1, further comprising two data memory devices operating at different clock frequencies in a normal operation and operating at an identical frequency in a scan mode, wherein the sheet resistance value of the first contact is higher than the sheet resistance value of the second contact, and the first contact is provided on a signal line for connecting the data memory devices to each other.

6. The semiconductor apparatus according to claim 1, further comprising first and second integrated circuit blocks, wherein the sheet resistance value of the second contact is lower than the sheet resistance value of the first contact, and the second contact is provided on a signal line for connecting the first and second integrated circuits to each other.

7. The semiconductor apparatus according to claim 1, further comprising a clock wiring, wherein the sheet resistance value of the second contact is lower than the sheet resistance value of the first contact, and the second contact is provided on the clock wiring.

8. The semiconductor apparatus according to claim 1, further comprising a power-supply wiring, wherein the sheet resistance value of the second contact is lower than the sheet resistance value of the first contact, and the second wiring is provided on the power-supply wiring.

9. The semiconductor apparatus according to claim 8, wherein the power-supply wiring is a power-supply wiring of an analog circuit.

10. The semiconductor apparatus according to claim 1, further comprising diffusion layer, wherein a part or all of the first contact or the second contact is not connected to the diffusion layer.

11. The semiconductor apparatus according to claim 1, wherein the first contact and the second contact are made of different materials.

\* \* \* \* \*